United States Patent
Hodes et al.

(10) Patent No.: US 7,204,298 B2
(45) Date of Patent: Apr. 17, 2007

(54) TECHNIQUES FOR MICROCHANNEL COOLING

(75) Inventors: Marc Scott Hodes, New Providence, NJ (US); Paul Robert Kolodner, Hoboken, NJ (US); Thomas Nikita Krupenkin, Warren, NJ (US); Wonsuck Lee, Basking Ridge, NJ (US); Alan Michael Lyons, New Providence, NJ (US); Todd Richard Salamon, Chatham, NJ (US); Joseph Ashley Taylor, Springfield, NJ (US); Donald P. Weiss, Cresskill, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 114 days.

(21) Appl. No.: 10/997,795

(22) Filed: Nov. 24, 2004

(65) Prior Publication Data

US 2006/0108097 A1 May 25, 2006

(51) Int. Cl.
*F28F 13/00* (2006.01)
(52) U.S. Cl. .................... 165/80.4; 361/699
(58) Field of Classification Search ...... 165/80.3–80.5, 165/185, 179, 181, 133, 134.1; 361/699, 361/702, 703
See application file for complete search history.

(56) References Cited

U.S. PATENT DOCUMENTS 5,655,600 A * 8/1997 Dewar et al. ............... 165/166
6,698,502 B1 * 3/2004 Lee ........................ 165/104.26
6,729,383 B1 * 5/2004 Cannell et al. ............. 165/80.3
2003/0029724 A1   2/2003 Derand et al.
2003/0094265 A1 * 5/2003 Chu et al. ................... 165/133
2003/0164231 A1 * 9/2003 Goodson et al. ........ 165/104.11
2004/0112585 A1 * 6/2004 Goodson et al. ............ 165/299
2005/0211417 A1 * 9/2005 Upadhya et al. ........... 165/80.4
2005/0211418 A1 * 9/2005 Kenny et al. .............. 165/80.4

FOREIGN PATENT DOCUMENTS

JP        2000-87921     *  3/2000
WO    WO 2004/042302 A    5/2004

OTHER PUBLICATIONS

Ou et al., "Laminar Drag Reduction in Microchannels Using Ultrahydrophobic Surfaces," American Institute of Physics, pp. 4635-4643 (2004).

* cited by examiner

*Primary Examiner*—Teresa J. Walberg

(57) ABSTRACT

Techniques for heat transfer are provided. In one aspect of the invention, a heat-transfer device is provided. The heat-transfer device comprises one or more microchannels suitable for containing a heat-transfer fluid, one or more of the microchannels having protruding structures on at least one inner surface thereof configured to affect flow of the heat-transfer fluid through the one or more microchannels. The structures may comprise posts coated with a hydrophobic coating.

21 Claims, 9 Drawing Sheets

TECHNIQUES FOR MICROCHANNEL COOLING

FIELD OF THE INVENTION

This invention relates generally to fluid mechanics and heat transfer and, more specifically, to techniques for thermal management in integrated circuits and other applications.

BACKGROUND OF INVENTION

Since advances in semiconductor, laser and power conversion technology are inevitably accompanied by higher powers and higher power densities, such advances cannot be exploited without concomitant advances in thermal management technologies. Thus, thermal management has emerged as a primary limiting design factor in electronic systems.

Personal computers (PCs) provide an excellent example of a thermal management challenge. Namely, with the desktop PCs of today, average heat fluxes experienced can be greater than 150 Watts per square centimeter and in localized regions, often referred to as hot spots, significantly larger average heat fluxes can occur, potentially as high as 500 Watts per square centimeter.

Research on the liquid cooling of electronics has been thriving over the past two decades due to the fundamental limits of the conventional (and ubiquitous) air-cooling approach. For example, for applications such as notebook computers which often require a spatial separation of the heat source and the heat sink, heat pipes are conventionally employed to absorb the heat generated by the heat source, transport it and spread it over the base of a heat sink. However, since heat pipes are passive devices, relying on surface tension to circulate the heat-transfer fluid, there are fundamental limits to the amount of heat that a heat pipe of a given geometry can transport. For example, with many applications, e.g., computer processors and radio frequency power transistors in cellular base stations, the maximum capacity of heat pipes is rapidly being approached or exceeded.

Microchannel cooling is another type of liquid cooling configuration currently under study. Because of the exceptionally high heat transfer coefficients associated with heat transfer to and from the fluid in microchannels, typically greater than or equal to about $1 \times 10^4$ Watts per square meter Kelvin ($W/m^2K$), only a very small temperature difference, e.g., only up to about a five degrees Celsius (° C.), is required to drive heat transfer between the fluid flowing through the microchannels and an adjacent heat source or heat sink. See, for example, R. J. Philips, *Microchannel Heat Sinks,* 2 Advances in Thermal Modeling of Electronic Components and Systems, 109–184 (1990), the disclosure of which is incorporated by reference herein. The heat transfer coefficient indicates quantitatively how much temperature difference between a surface and a fluid is required to transfer a given heat flux (measured in Watts per square meter) from the surface into the fluid. This has the significant advantage of maintaining the fluid near the operating temperature of the heat source, allowing for a greater temperature difference (driving force) for heat transfer to the ambient environment, which helps minimize heat sink geometry.

One problem with conventional microchannel cooling, however, is that the pressure drop associated with pumping fluid through a microchannel is very high since the channels are so small. As a result, higher power fluid pumps, which are typically larger, heavier, more expensive and more complicated, are needed to overcome the drop. Another problem associated with conventional microchannel cooling is that the efficiency of heat transfer to the fluid remains constant along the length of the microchannel. Namely, the temperature difference between the microchannel wall and the fluid required to transfer a given heat flux into the fluid remains constant along the length of the microchannel. As such, hot spots on the heat source (corresponding to localized regions of high power dissipation) remain at temperatures higher than other regions and introduce thermal stresses from the resulting temperature gradient.

Hot spot mitigation is a formidable problem faced by the electronics industry. See, for example, R. Viswanath et al., *Thermal Performance Challenges from Silicon to Systems,* INTEL TECH JOURNAL (August 2000), the disclosure of which is incorporated by reference herein. The result is that, increasingly, the hot regions on a die are very localized and limit the power that can be dissipated by the electronics. These limitations further limit the functionality of the die.

Therefore, improved thermal management technologies suitable to accommodate the increasing heat-dissipation needs of the electronics industry are needed.

SUMMARY OF THE INVENTION

Techniques for heat transfer are provided. In one aspect of the invention, a heat-transfer device is provided. The heat-transfer device comprises one or more microchannels suitable for containing a heat-transfer fluid, one or more of the microchannels having protruding structures on at least one inner surface thereof configured to affect flow of the heat-transfer fluid through the one or more microchannels. The structures may comprise posts coated with a hydrophobic coating.

In an illustrative embodiment, the posts comprise nanoposts. Further, the nanoposts may receive a hydrophobic coating forming superhydrophobic nanostructures. The dimension, pitch and composition of these superhydrophobic nanostructures may be adjusted to reduce a pressure drop associated with pumping fluid through the microchannels and/or adjust the efficiency of heat transfer.

DETAILED DESCRIPTION OF THE INVENTION

Figure 1:
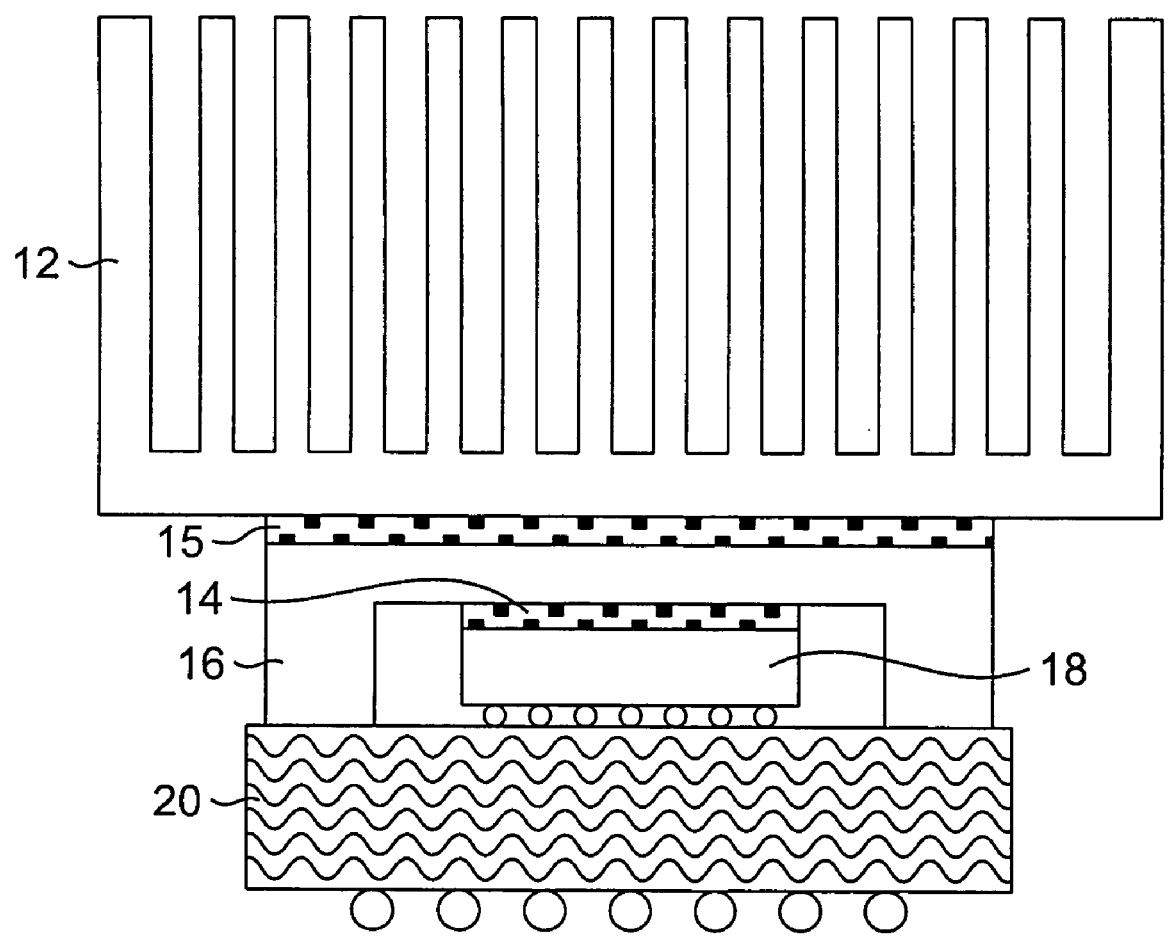
FIG. 1 is a diagram illustrating a conventional heat-transfer device.

Prior to describing the inventive aspects and features of the present techniques, a conventional heat-transfer device will first be described. FIG. 1 is a diagram illustrating a conventional heat-transfer device. As shown in FIG. 1, conventional heat-transfer device 10 comprises heat sink 12, thermal interface materials (TIMs) 14 and 15, heat spreader 16, integrated circuit (IC) die 18 (heat source) and ball grid array (BGA) substrate 20. Such a heat-transfer device may comprise, by way of example, a central processing unit (CPU) of a personal computer (PC).

Heat spreader 16 may comprise a block of high thermal conductivity material, including, but not limited to, copper or an alloy thereof. Alternatively, heat spreader 16 may comprise a vapor chamber. A vapor chamber is a flat, hollow plate with internal structures that make it function like a heat pipe. For example, with the highest power devices, e.g., outputting 100 Watts or greater, heat spreader 16 may be constructed of a vapor chamber (for example, a rectangular heat pipe having a footprint of a square centimeter or more and covering much of the area of IC die 18) to minimize thermal impedance both vertically as well as laterally.

Heat sink 12 may be a finned heat sink and attached, and thermally connected, to heat spreader 16 to dissipate heat into the ambient air. A layer of TIM, e.g., TIM 15, is typically present between heat spreader 16 and heat sink 12, however, heat sink 12 may be integrated into heat spreader 16.

Heat sink 12 may be fan cooled. For example, if the IC die 18 comprises a CPU, a graphics processing unit (GPU) or other IC heat source of a PC, heat generated by the heat source can be conducted through TIMs 14 and 15, heat spreader 16 and heat sink 12 and carried into the ambient air by convection.

Figure 2A:
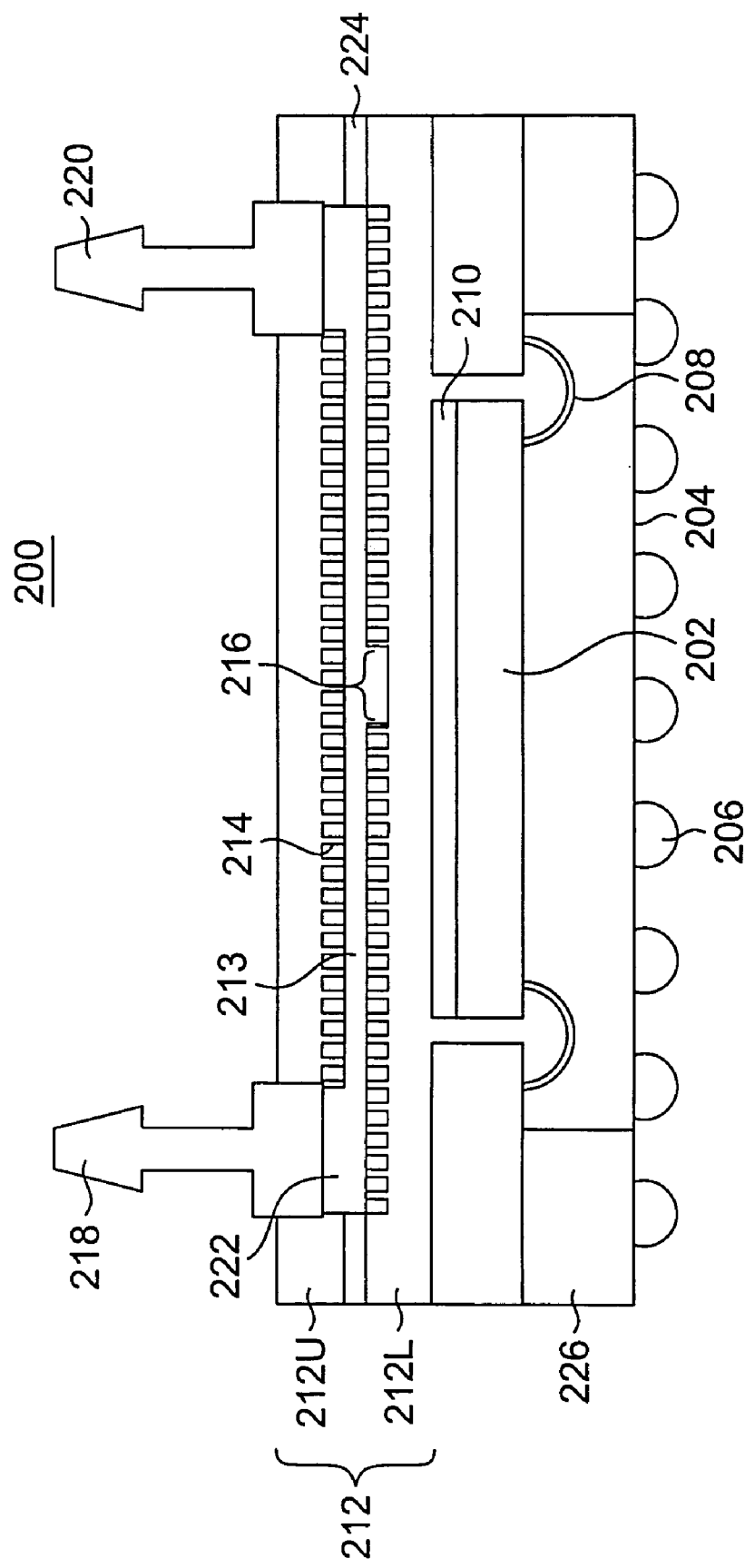
FIGS. 2A–B are diagrams illustrating an exemplary single microchannel heat-transfer device configuration used to demonstrate the effectiveness of placing structures configured to affect fluid flow in a microchannel.
Figure 2B:
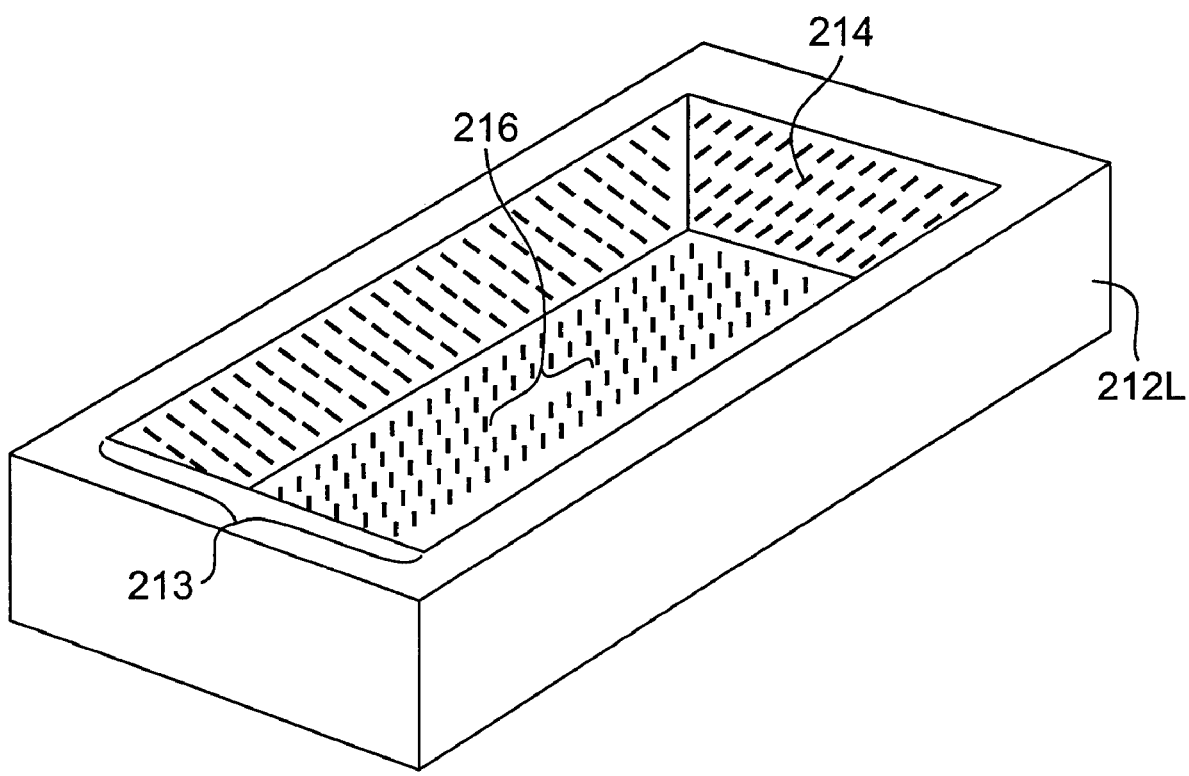

FIGS. 2A–B are diagrams illustrating an exemplary single microchannel heat-transfer device configuration used to demonstrate the effectiveness of placing structures configured to affect fluid flow in a microchannel.

In FIG. 2A, heat-transfer device 200 comprises a heat source 202. According to an exemplary embodiment, heat source 202 comprises an IC, e.g., attached to BGA substrate 204, having solder balls 206 and wire bonds 208. However, the teachings presented herein are not limited to this or any other particular heat source configuration. For example, heat source 202 may comprise a leaded package attached to a printed circuit board. Examples of suitable heat sources include, but are not limited to, application specific integrated circuits (ASICs), CPUs, GPUs, graphic chips, field-programmable gate arrays (FPGAs), lasers and power transistors.

On a side of heat source 202 opposite BGA substrate 204, die-attach adhesive 210 is employed to physically attach and thermally couple heat source 202 to microchannel heat sink 212. Microchannel heat sink 212 comprises an upper portion 212U and a lower portion 212L. It is important to note that the use of die-attach adhesive 210 is optional and other suitable attachment methods may be employed, including, but not limited to, soldering. According to an exemplary embodiment, microchannel heat sink 212 comprises at least one substantially rectangular microchannel, e.g., microchannel 213, the cross sectional area of which is from about 50 to about 500 microns in length and up to about 500 micrometers in width. According to this illustrative embodiment, the cross sectional area of the microchannel is such that the shortest dimension must be less than or equal to about 500 microns in order for the channel to be considered a microchannel. The length of the microchannel along the direction of fluid flow is arbitrarily long, depending on the particular application. Microchannel heat sink 212 comprises a plurality of structures 214. Structures 214 protrude into microchannel 213 and are configured to affect fluid flow through microchannel heat sink 212. For example, structures 214 may comprise superhydrophobic nanostructures. As will be described in detail below, the superhydrophobic nanostructures may comprise nanoposts having hydrophobic coatings thereon. Further, as will be described in detail below, the superhydrophobic nanostructures may be tuned or otherwise adjusted to reduce a pressure drop associated with pumping fluid through the microchannel at a given flow rate and/or to tune or otherwise adjust the efficiency of heat transfer in certain areas.

Heat-transfer device 200 further comprises fluid inlets/outlets 218 and 220 in fluid communication with microchannel 213 via, e.g., plenum 222. As will be described in detail below, the heat-transfer fluid, e.g., coolant, employed in heat-transfer device 200 may comprise any fluid suitable for removing heat from a heat source, including, but not limited to, water. Heat-transfer device 200 further comprises adhesive weld 224 and substrate 226. The adhesive weld 224 joins upper portion 212U and lower portion 212L of heat sink 212. Substrate 226 may be a printed wiring board interconnection substrate.

The placement and geometry of the nanoposts may be varied to tune the heat removal characteristics of the system. More particularly, variations in the placement and geometry of the nanoposts can be used to minimize fluid pressure drops through the microchannels and to manage hot spots on the heat source, e.g., by controlling the local thermal resistance between the heat source and the heat-transfer fluid. For example, structures 214 are not present at location 216 in microchannel 213 to improve localized heat transfer in that area. The area of heat source 202 directly below location 216 may comprise a hot spot. As used herein, the term "hot spot" refers to an area on, e.g., an IC die, that generates higher levels of heat flux (as compared to other areas of the die). For example, areas of an IC die containing dense clusters of transistors produce a high heat flux. In localized regions where the heat flux on the die is high, heat transfer to the fluid in the microchannel can be made to be more efficient, such that the heat source is substantially isothermal.

According to the teachings presented herein, the term "isothermal" is used to refer to all portions of a surface of an object, e.g., the heat source, being at a substantially constant temperature. For example, with a temperature gradient across a surface of the heat source of less than or equal to about five degrees Celsius (° C.), preferably less than or equal to one ° C., the heat source is considered herein to be substantially isothermal. As such, this isothermalization serves to maintain the heat source at the highest mean temperature, typically the best temperature, for operation. Further, isothermalization eliminates thermal stresses on the heat source and simplifies thermal designs. Also, without hot spot thermal management, regions of the heat source at lower heat flux levels can become unnecessarily cooled below the minimal operational temperature.

Regarding hot spots on the heat source, without having spatially precise tunability of heat transfer, the temperature of the heat-transfer fluid employed must be reduced to enable sufficient cooling of the highest temperature hot spots. To further reduce the heat-transfer fluid temperature, larger heat sinks need to be employed. Larger heat sinks require larger fans in order to provide sufficient cooling.

Larger fans are noisier and take up more space. Further, employing a larger heat sink might not be a viable solution, as certain areas of the heat source might become unnecessarily cooled below the minimal heat transfer temperature. With precise spatially tunability of heat transfer, however, substantially isothermal heat sources may be achieved, potentially operating at higher temperatures than conventional packages, which translates to smaller air-side heat sinks and/or cooling fans, or to higher power dissipation limits with the same size heat sinks and/or cooling fans. As such, the techniques described herein may be employed to operate electronics devices at or below their maximum junction temperature, which is typically less than 125° C.

FIG. 2B is a longitudinal cross-sectional view depicting the lower portion 212L of microchannel heat sink 212. Lower portion 212L of microchannel heat sink 212 comprises a plurality of structures 214 therein. Further, as in FIG. 2A, structures 214 are not present at location 216 to improve localized heat transfer in that area.

As will be described in detail below, areas of the microchannels having a greater density of superhydrophobic nanostructures can be made to less efficiently transfer heat to the heat-transfer fluid from the heat source, e.g., as compared to areas of the microchannel having few, or no, superhydrophobic nanostructures present (e.g., location 216). The reason for this variation in heat transfer is that highly efficient heat transfer occurs where the heat-transfer fluid comes in direct contact with the microchannel walls. By comparison, as will be described in conjunction with the description of FIG. 5, below, the presence of nanoposts having hydrophobic coatings prevents the heat-transfer fluid from contacting, and wetting, the walls of the microchannels where the nanoposts are present. Thus, where hydrophobic nanostructures are present, heat must conduct through the nanoposts themselves and through a vapor layer existing between the heat-transfer fluid stream and the walls of the microchannels to reach the heat-transfer fluid. This increases the thermal resistance between the heat source and fluid where the nanoposts are present.

The inventive techniques, as described herein, include without limitation embodiments involving indirect liquid cooling and embodiments involving direct liquid cooling. With indirect liquid cooling, the heat-transfer fluid in the microchannels is physically isolated from the heat source. With direct liquid cooling, the heat-transfer fluid in the microchannel comes directly in contact with a surface of the heat source.

The illustrative embodiments use superhydrophobic nanostructures that control friction and heat transfer over spatially precise and selectable portions of a microchannel. Further, as highlighted above, the superhydrophobic nanostructures may comprise nanoposts having a hydrophobic coating thereon. Suitable hydrophobic coatings include, but are not limited to, fluorinated polymers having a Teflon-like structure (such as Cytop, manufactured by the Asahi Glass Co., LTD. of Tokyo Japan), amorphous, random fluorocarbon materials having the general formula $CF_x$ and silane-based self-assembled monolayers (SAMs) fabricated from chlorosilanes and/or alkoxysilanes.

The hydrophobic coatings may be applied to the nanoposts as thin conformal layers by any suitable application method, including, but not limited to, spraying, spin-coating, printing, dipping and chemical vapor deposition (CVD). For example, hydrophobic coatings comprising fluorinated polymers are typically applied by spin-coating onto the nanoposts followed by baking to evaporate remaining solvent and to cure the polymer. These fluorinated polymer coatings typically are applied to a thickness of up to about 50 nanometers (nm). Hydrophobic coatings comprising fluorocarbon materials having the general formula $CF_x$ are typically applied in a chemical vapor deposition reactor using a fluorinated hydrocarbon feed gas, such as $CF_4$. These fluorocarbon materials having the general formula $CF_x$ typically are applied to a thickness of up to about 30 nm. Hydrophobic coatings comprising silane-based SAMs are typically applied by immersing the nanoposts into a hexane solution of a silane (for example, trimethyl-chloro-silane) followed by rinsing to remove unreacted material. These silane-based SAMs typically are applied to a thickness of between about two to about five nm. The coatings presented herein enable microchannel cooling, long known to be one of the most efficient modes of heat transfer for the cooling of electronics, to finally be commercially viable, by dramatic reduction of the normally prohibitively high pressure drop through microchannels.

In the illustrative embodiments, the maximum rate of heat that may be transferred to and from the fluid in a microchannel is thus limited only by the flow rate of fluid pumped through it. The flow rate of the fluid (e.g., measured as kilograms per second (kg/sec) or cubic meters per second ($m^3$/sec)) through the microchannels is a function of the pressure drop across the microchannel. According to the present teachings, the pressure drop through a microchannel is reduced to manageable values by the superhydrophobic nanostructures. Fluid pressure drops through the microchannels may be reduced by 50 percent or more. This enables smaller, lighter, cheaper and less complicated pumps to be used to pump fluid through the microchannels using less pumping power. This factor is particularly important in the consumer electronics space (e.g., for laptops) wherein weight, power, size and cost constraints are very stringent.

Figure 3:
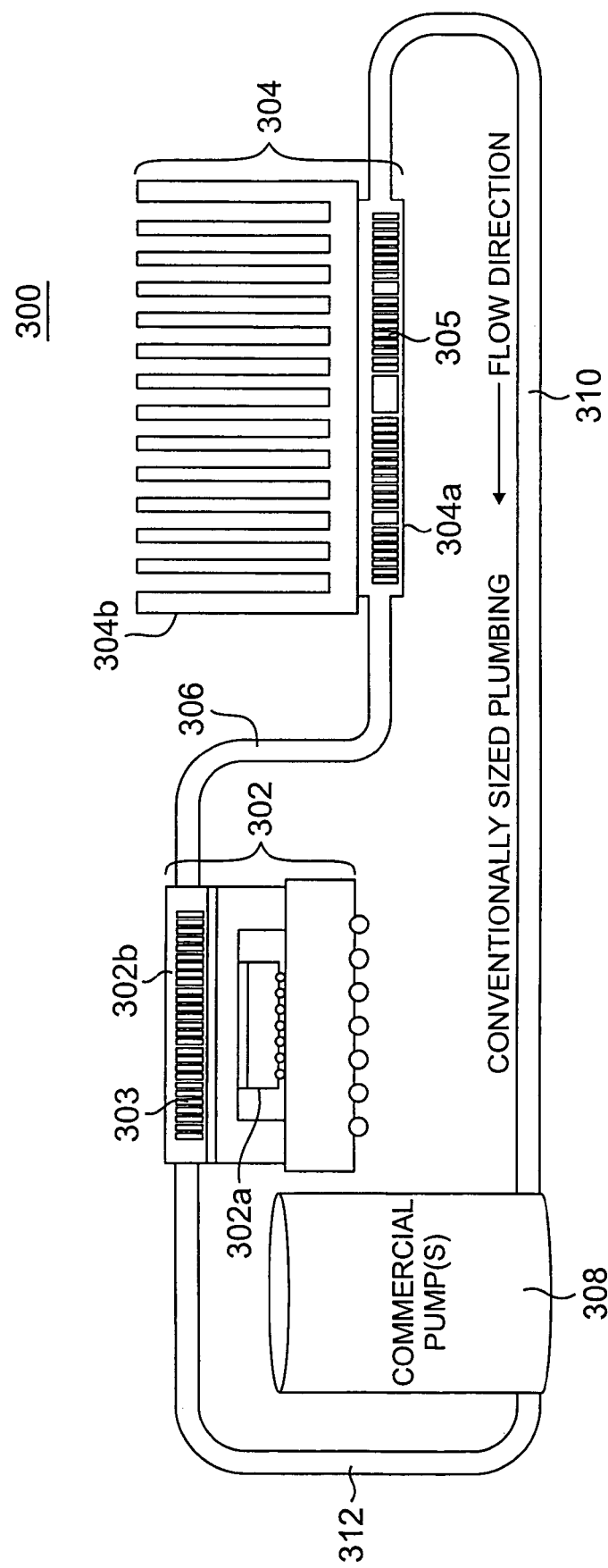
FIG. 3 is a diagram illustrating an exemplary closed microchannel cooling system.

FIG. 3 is a diagram illustrating an exemplary closed microchannel cooling system. In FIG. 3, microchannel cooling system 300 comprises microchannel heat sink assembly 302. Microchannel heat sink assembly 302 comprises heat source 302a (for example, an IC die which may produce temperatures of greater than about 100° C., for example between about 100° C. to about 125° C.) and microchannel heat sink 302b comprising a plurality of microchannels 303. Microchannel cooling system 300 further comprises air-side heat sink 304 (fluidly connected to microchannel heat sink assembly 302, e.g., by fluid conduit 306) and fluid pump 308 (fluidly connected to air-side heat sink 304, e.g., by fluid conduit 310). Fluid pump 308 is, in turn, connected to microchannel heat sink assembly 302, e.g., by fluid conduit 312. Fluid conduits 306, 310 and 312 may comprise standard fluid plumbing of conventionally employed lengths and diameters. Further, according to an exemplary embodiment, one or more superhydrophobic nanostructures may also be present inside one or more of fluid conduits 306, 310 and 312. According to this exemplary embodiment, the cross sectional area of the conduits may then be reduced, as the velocity profile of the fluid flowing through the conduits will be altered by the nanostructures.

Microchannel heat sink 302b comprises a plurality of microchannels 303, in this case 24 separate channels, one or more of which comprise superhydrophobic nanostructures on one or more surfaces thereof (not shown). The structure of a microchannel heat sink will be described in detail, for example, in conjunction with the description of FIGS. 4A–B, below.

Air-side heat sink 304 also comprises a microchannel heat sink 304a having a plurality of microchannels 305 therein, one or more of which comprise superhydrophobic nanostructures on one or more surfaces thereof (not shown). Air-side heat sink 304 further comprises heat-dissipating fins 304b.

Microchannels 305 ensure efficient heat spreading and transport of heat to heat-dissipating fins 304b. However, the presence of microchannels 305 on air-side heat sink 304 is not required, for example, when air-side heat sink 304 is not in a limited space environment and can be made larger to accommodate a greater amount of heat dissipation. As such, according to an exemplary embodiment, air-side heat sink 304 does not comprise microchannels.

Fluid pump 308 may comprise, e.g., any suitable, commercially available fluid pumping device. According to an exemplary embodiment, fluid pump 308 comprises a plurality of commercially available fluid pumps operated in parallel, e.g., to meet the necessary pressure requirements to pump the heat-transfer fluid through the microchannels. Suitable commercially available pumps are produced, for example, by Mesoscopic Devices, LLC of Broomfield, Colo.

According to the exemplary embodiment shown in FIG. 3, heat dissipated by heat source 302a is transferred to a heat-transfer fluid which flows through the components and conduits of microchannel cooling system 300. The heat-transfer fluid entering microchannel heat sink assembly 302 has to have a temperature less than the temperature at heat source 302a in order for heat to be transferred to it. For example, if the temperature at heat source 302a is 65° C., and the temperature of the heat-transfer fluid is 61° C. (the direction of flow being such that the heat-transfer fluid entering microchannel heat sink assembly 302 has been cooled, e.g., by having been passed through microchannels 305 of air-side heat sink 304), then heat will pass from heat source 302a, to the heat-transfer fluid. It is important to note that the operating temperatures designated herein are merely exemplary and the teachings presented herein should not be limited to any particular temperature values.

Some amount of heating of the fluid will occur at microchannel heat sink 302b, heating the heat-transfer fluid by about one ° C. (and potentially up to about five ° C.). Thus, for example, the fluid flowing through fluid conduit 306, after having flowed through microchannel heat sink assembly 302, may have a temperature of about 64° C. Little cooling will occur in any of the fluid conduits.

The majority of the cooling will occur when the heat-transfer fluid flows through microchannels 305 of air-side heat sink 304. For example, the temperature of the heat-transfer fluid may be reduced there by up to about three ° C. As such, the temperature of the fluid exiting air-side heat sink 304 is about 61° C. (the same temperature at which the heat-transfer fluid enters microchannel heat sink assembly 302).

According to the exemplary embodiment shown in FIG. 3, two heat sinks are required, i.e., one on the heat source side of the system and one on the air side of the system. This ensures that heat is transferred from the heat source to the heat-transfer fluid and from the heat-transfer fluid to the air-side heat sink, with minimal temperature differences. This maximizes the available temperature difference, e.g., between the temperature of the air-side heat sink and the temperature of the ambient air. Maximizing the available temperature difference between the temperature of the ambient air and the temperature of the air-side heat sink, in turn, minimizes the air-side heat sink volume required.

Water has been chosen as the heat-transfer fluid in the illustrative embodiments because its high specific heat minimizes the necessary flow rates. The maximum saturation pressure of the heat-transfer fluid, e.g., the water, in the closed system shown in FIG. 3 occurs at the maximum temperature in the system (e.g., 65° C.) and equals 0.25 atmospheres (atm). However, as indicated previously, other fluids may be used.

Further, since the static pressure within the closed system typically exceeds 0.25 atm, the water will usually be in a liquid phase in this example. Additionally, two-phase systems may be used in order to reduce the required flow rate of the heat-transfer fluid. Such an implementation may require gas compression to high pressure and additional operating power ultimately dissipated as heat by the air-side heat sink. For direct liquid cooling applications, as will be described in detail below, fluid operating temperatures above 100° C. are expected because fluid directly contacts the heat source, and thus two-phase liquid cooling, with water as the heat-transfer fluid, may be advantageous.

In the illustrative example shown in FIG. 3, the maximum temperature of the air directed over the microchannel heat sink assembly is assumed to be about 45° C., which is a realistic value for consumer electronics applications. As is often the case, the temperature driving force for heat transfer from the air-side heat sink to the ambient air is very modest, in this case only 20° C. Therefore, it is important that as little as possible of this 20° C. temperature differential be required to transfer the heat load from the microchannel heat sink assembly into the heat-transfer fluid and from the heat-transfer fluid to the heat-dissipating fins on the air-side heat sink, so as to minimize the size of the air-side heat sink and/or the fans used to cool the air-side heat sink.

The flow rate of water required to absorb 150 Watts, for example, with a three ° C. temperature rise is 717 milliliters per minute (ml/min), which does not constitute a prohibitively large flow rate. Small commercially available pumps, when operated in parallel, would require only 45 cubic centimeters ($cm^3$) of total space and consume about three Watts of total power to deliver over 900 ml/min of water at a pressure of two bar. The miniaturization of such pumps continues in the industry.

Moreover, pumps are achieving progressively higher pressure and flow rate operating points. As shown in FIG. 3, and described above, assuming that the heat-transfer fluid enters the microchannel heat sink assembly at 61° C., leaves the microchannel heat sink assembly at 64° C. and the heat source temperature is 65° C., one to four ° C. is available to transfer the heat from the heat source into the heat-transfer fluid. Thus, with as low a pressure drop as possible, the microchannels can be optimized to transfer a large amount of heat with a correspondingly small driving force for heat transfer (e.g., one to four ° C.).

Figure 4A:
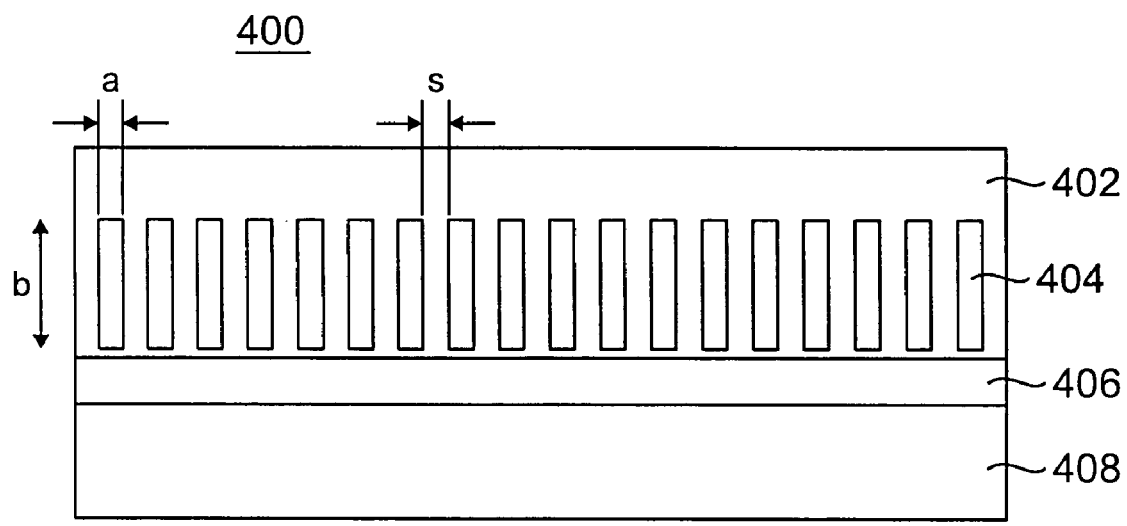
FIGS. 4A–B are diagrams illustrating exemplary microchannel heat sink geometry.
Figure 4B:
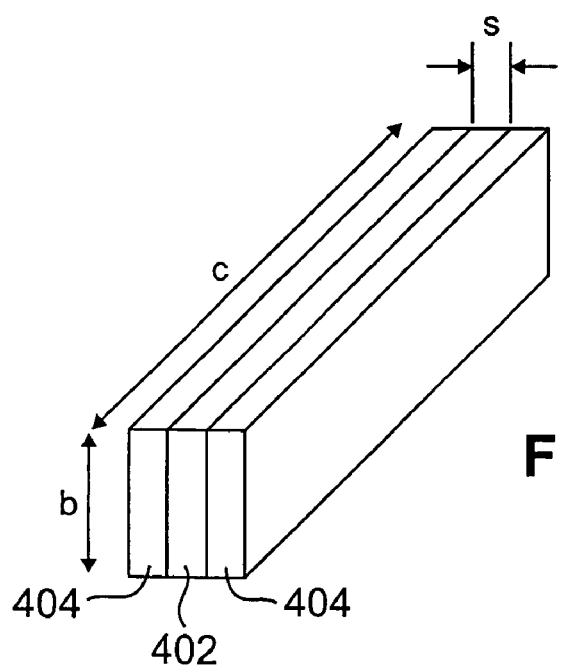

FIGS. 4A–B are diagrams illustrating exemplary microchannel heat sink geometry. The microchannel heat sinks shown in FIGS. 4A–B are similar to the microchannel heat sinks described above, e.g., microchannel heat sink 302b, described in conjunction with the description of FIG. 3, above.

FIG. 4A illustrates the width a, height b and spacing s dimensions of an exemplary microchannel heat sink configuration. In FIG. 4A, microchannel heat sink assembly 400 comprises microchannel heat sink housing 402, microchannels 404, solder layer 406 and integrated heat source 408. In this embodiment, microchannels 404 comprise a plurality of superhydrophobic nanostructures on one or more surfaces thereof (not shown). Depictions of such superhydrophobic nanostructures are shown, for example, in FIG. 5 and FIGS. 6A–C, and described in detail below.

Microchannel heat sink housing 402 may comprise a material selected from the group consisting of copper, silicon and combinations comprising at least one of the foregoing materials. Other materials can also be used. Further, according to an exemplary embodiment, integrated heat source 408 comprises a 65° C., 160 Watt heat source.

FIG. 4B illustrates the height b, depth c and spacing s dimensions of an exemplary microchannel unit cell, e.g., of two adjacent microchannels 404 separated by a fin of microchannel heat sink housing 402. According to an exemplary embodiment, the walls of microchannel heat sink housing 402 are modeled as thermally conductive fins to transfer heat to the heat-transfer fluid in microchannels 404.

Further, according to an exemplary embodiment, the nanopost material may be varied, e.g., to vary the thermal conductivity of the nanoposts. By way of example only, when the nanoposts comprise silicon, they are thermally conductive. However, if the silicon is oxidized to form silicon dioxide, the heat transfer efficiency of the nanoposts is altered, as silicon dioxide is a poorer thermal conductor than silicon. For example, the thermal conductivity of polycrystalline silicon dioxide (fused silica) is 1.38 Watts per meter Kelvin (W/m-K), versus 180 W/m-K for silicon. Heat transfer efficiency is described in conjunction with the description of Newton's Law of Cooling, below.

A number of factors are to be considered when optimizing the number n of microchannels, their geometry, i.e., width a, height b, depth c and spacing s, and their composition. With conventional microchannel cooling technology, there is an important trade-off between the heat transfer and pressure drop through each microchannel. Therefore, the heat transfer coefficient very strongly increases with decreasing hydraulic diameter of conventional microchannels (essentially their width) at the cost of an increased pressure drop. For example, the pressure drop corresponding to a given flow rate of fluid for fully developed laminar flow through a microchannel is approximately inversely proportional to the cube of the hydraulic diameter of the microchannel. The hydraulic diameter of the microchannel is equal to its cross-sectional area divided by its wetted perimeter, e.g., approximately two times the distance between the microchannel walls in FIG. 4A.

Figure 5:
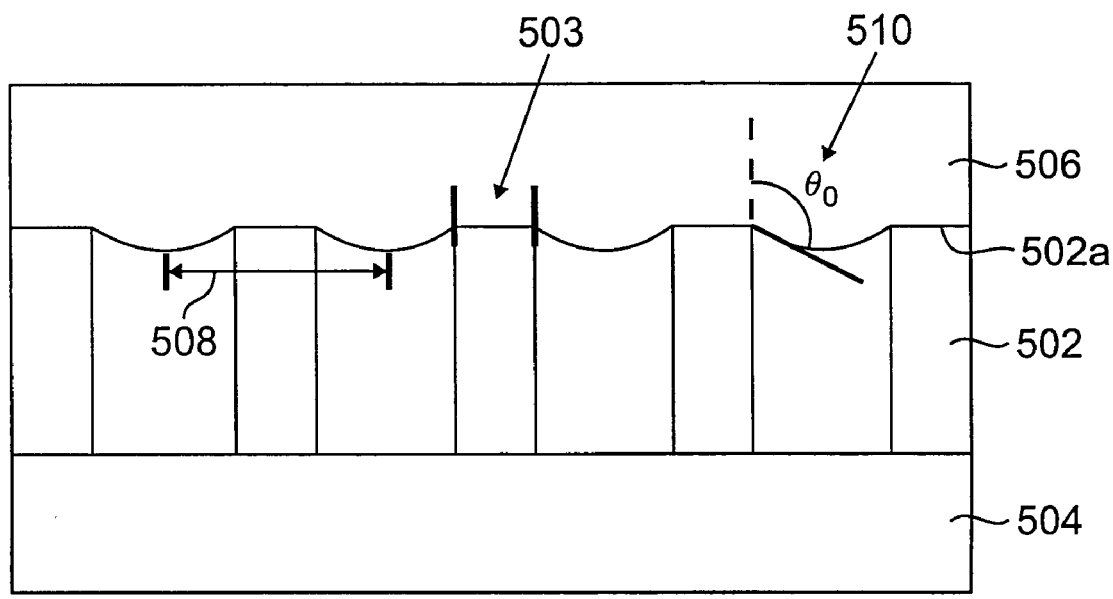
FIG. 5 is diagram illustrating an exemplary microchannel nanopost configuration.

However, as highlighted above, nanoposts with hydrophobic coatings are employed to mitigate the pressure drop associated with the fluid flow through the microchannels, e.g., by minimizing flow resistance. FIG. 5 is a diagram illustrating an exemplary microchannel nanopost configuration. Namely, in FIG. 5, nanoposts 502 (e.g., cylindrical posts with a cross-sectional area 503) having a hydrophobic coating thereon are integral to a solid base 504, e.g., a microchannel wall. As will be described in detail below, only tips 502a of nanoposts 502 are wetted by heat-transfer fluid 506, e.g., flowing through the microchannel. As will further be described in detail below, factors such as the pitch of the nanoposts also can affect fluid flow through the microchannels.

In FIG. 5, the local contact angle 510 between heat-transfer fluid 506 and nanoposts 502 is larger than 90 degrees. Therefore, the heat-transfer fluid does not wet between the nanoposts, i.e., the microchannel wall is superhydrophobic. Consequently, the conventional no-slip (zero velocity) boundary condition does not apply along the wall of the microchannel. The usual no-slip boundary condition on the fluid velocity applies only at tips 502a of nanoposts 502, which are extremely small, e.g., occupying up to only about one percent of the surface area of the microchannel. The term "no-slip boundary condition" means that in the area where a fluid is in contact with a solid, the fluid velocity approximates zero. For example, the fluid cannot "slip" over a solid surface, however, a fluid can slip over a liquid-air interface.

Everywhere else, e.g., greater than or equal to about 99 percent of the surface area of the microchannel, a slip boundary condition applies, as surface tension prevents heat-transfer fluid 506 from wetting the walls of the microchannel. This surface tension condition of heat-transfer fluid 506 is illustrated in FIG. 5 as the concave dips of heat-transfer fluid 506 existing between tips 502a of nanoposts 502. As will be described in conjunction with the description of FIGS. 6A–C, below, the pitch 508 of the nanoposts may be varied. Computational simulations have shown that arrays of nanoposts can increase the flow rate for a given pressure drop by up to about 200 percent without adversely affecting heat transfer. This enables microchannel cooling to be implemented without using unrealistically large pumps that demand too much power.

By spatially varying the density and diameter of the nanoposts, the friction factor (e.g., pressure drop) profile along a microchannel may be tuned. In fact, according to the teachings presented herein, fluid pressure drop may be reduced by up to about 50 percent or more through the microchannels for a fixed flow rate of fluid.

Further, the nanopost spacing and the hydrophobic coating material may be chosen, such that, due to the surface tension of the heat-transfer fluid, it is energetically unfavorable for the fluid to wet into the space between the nanoposts. See, for example, Krupenkin et al., *From Rolling Ball to Complete Wetting: the Dynamic Tuning of Liquids on Nanostructures Surfaces,* 20 LANGMUIR 3824 (2004), the disclosure of which is incorporated by reference herein. As described above, in configurations wherein the nanoposts only comprise about one percent of the surface area of the microchannel, the fluid is primarily in contact with the thin layer of air and water vapor separating the bulk heat-transfer fluid from the microchannel wall. This particular configuration allows the heat-transfer fluid to more easily flow through the microchannel, because the heat-transfer fluid experiences minimal flow resistance from the adjacent air layer due to its low viscosity. This is in contrast with the small amount of fluid in contact with the nanoposts which experiences significant drag due to adherence of fluid particles to the non-deformable nanopost surface.

The configuration shown in FIG. 5 may be compared with a "no-slip boundary condition." Thus according to the configuration depicted in FIG. 5, the fluid boundary is at a liquid-air interface (except for the minimal area corresponding to the tips of the nanoposts).

Figure 6A:
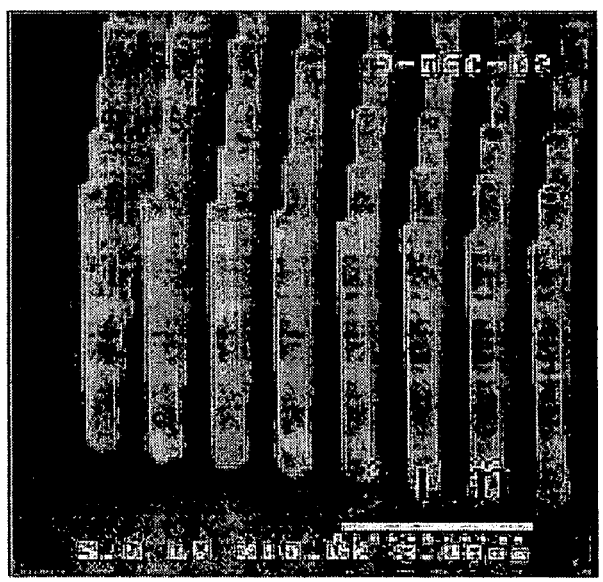
FIGS. 6A–C are images illustrating variations in nanopost pitch.
Figure 6B:
Figure 6C:
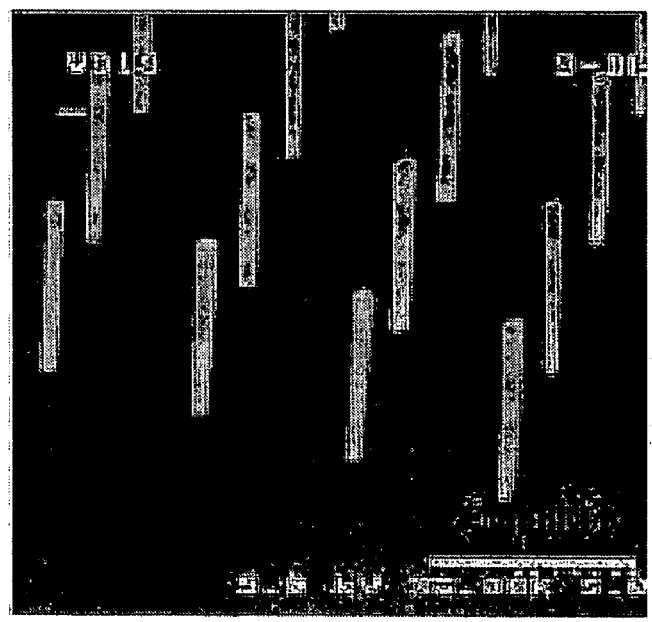

FIGS. 6A–C are images illustrating variations in nanopost pitch. The nanoposts shown in FIGS. 6A–C all have the same diameter. According to an illustrative embodiment, the nanoposts have a diameter of up to about 400 nm. Further, according to the teachings presented herein, the pitch of the nanoposts may be tuned, such that at higher temperatures, the heat-transfer fluid penetrates the nanoposts and wets the microchannel wall(s), primarily because changes in fluid surface tension drop the contact angle with the nanoposts to less than 90 degrees. The nanoposts shown in FIG. 6B have a greater pitch than those shown in FIG. 6A. The nanoposts shown in FIG. 6C have a greater pitch than those shown in FIG. 6B. For reference, a three micrometer scale is provided in each of FIGS. 6A–B and a five micrometer scale is provided in FIG. 6C.

Nanopost geometry is further described in U.S. patent application Ser. No. 10/403,159 entitled "Method and Apparatus for Controlling the Movement of a Liquid on a Nanostructured Surface or Microstructured Surface," U.S. patent application Ser. No. 10/649,285 entitled "Method and Apparatus for Controlling Friction Between a Fluid and a Body" and U.S. patent application Ser. No. 10/674,448 entitled "Method and Apparatus for Controlling the Flow Resistance of a Fluid on Nanostructured or Microstructured Surfaces," the disclosures of which are incorporated by reference herein. Further, it is to be understood that the teachings presented herein should be construed as being limited to any one superhydrophobic nanostructure in particular. For example, the superhydrophobic nanostructures may comprise continuous rectangular structures running both longitudinally and transversally through the microchannels.

Figure 7:
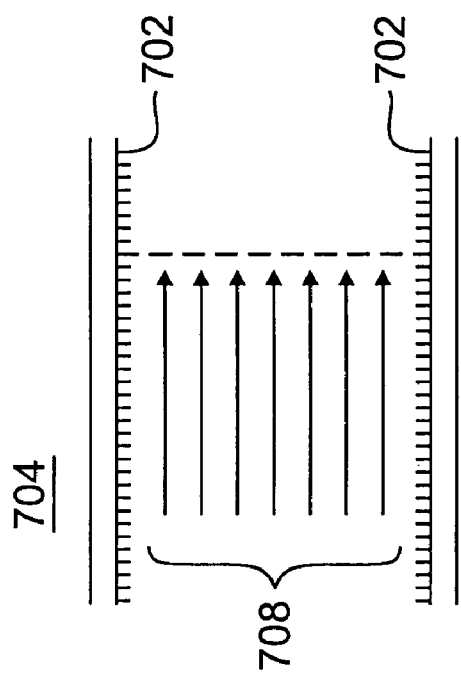
FIG. 7 is a diagram illustrating how superhydrophobic nanostructures may affect the velocity profile of a fluid.
Figure 7:
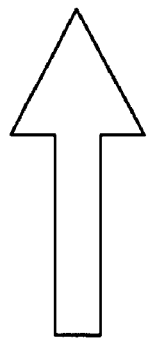
Figure 7:
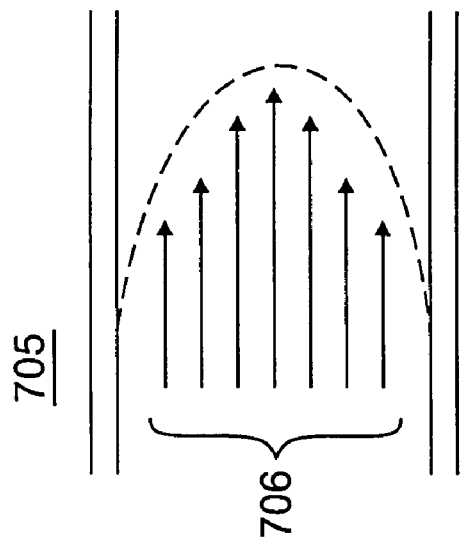

FIG. 7 is a diagram illustrating how superhydrophobic nanostructures may affect the velocity profile of a fluid. In FIG. 7, superhydrophobic nanostructures 702 on the inner surfaces of conduit 704 (versus conduit 705 having no superhydrophobic nanostructures) cause parabolic profile 706 to be replaced by low friction plug-type flow 708. It is important to note that the depictions in FIG. 7 are merely exemplary illustrations of how flow is altered by superhydrophobic nanostructures, and it is to be understood that other flow patterns might be achieved, e.g., with different channels.

As mentioned above, heat transfer from the walls of the microchannel to the heat-transfer fluid is predominantly through the nanoposts, because of the comparatively high resistance to heat conduction that exists through the layer of, e.g., water vapor, thermally in parallel with the nanoposts, especially when the nanoposts are of a sufficiently high thermal conductivity, e.g., greater than or equal to about 7,000 times that of air (e.g., when they are made of copper, silicon, aluminum, tungsten or alloys thereof). In an exemplary embodiment, the nanoposts comprise a tungsten-copper alloy which has an expansion coefficient similar to silicon. Further, the nanoposts may comprise a fluorinated polymer material that, for example, when combined with the hydrophobic coatings, described above, produce all-polymeric superhydrophobic nanostructures.

For example, silicon has a thermal conductivity of 180 W/m-K, whereas air has a conductivity of 0.026 W/m-K. If the nanoposts occupy one percent of the area of the microchannel surface and air covers the other 99 percent, then conductance of the nanoposts is equivalent to that of a uniform layer of conductivity 1.8 W/m-K, which is greater than the conductance of an air layer by a factor of 69. In this example, the heat conduction through the air layer is negligible. This result is independent of the height of the nanoposts. The height of the nanoposts determines the absolute magnitude of the thermal resistance. For example, if the nanopost comprises silicon and has a height of two micrometers, then the thermal resistance, for a unit area of one square centimeter, is $2 \times 10^{-6}$ m/[1.8 W/m-K·(0.01 m)$^2$] =0.011° C./W. This is a very low value. If, however, the nanoposts are made of silicon dioxide (conductivity 1.38 W/m-K), are ten microns in height and cover 0.1 percent of the area, then they have an effective conductance of a uniform layer of conductivity of 0.001·1.4 W/m-K=0.0014 W/m-K. In this case, the heat conduction through the nanoposts is negligible, and the structure acts thermally similar to a layer of air whose thermal resistance is about $10 \times 10^{-6}$ m/[0.026 W/m-K·(0.01 m)$^2$]=3.8° C./W because the thermal resistance of the air layer is small compared to that through the nanoposts. This is a very high value. Thus, by altering the pitch, length and composition of the nanoposts in different locations, the thermal resistance can be spatially tuned for hot spot isothermalization.

To further maximize heat transfer efficiency, the thermal interface between the heat source and the microchannel heat sink, e.g., heat source 302a and microchannel heat sink 302b of microchannel heat sink assembly 302 of FIG. 3, described above, should be optimized. Compliant conductors (e.g. solders), appropriate surface finishes, expansion matched materials and advanced assembly techniques can be employed to achieve low thermal impedance values across a reliable joint.

By comparison, heat transfer and heat spreading in the base of the air-side heat sink, e.g., air-side heat sink 304 comprising microchannels 305 and heat-dissipating fins 304b of FIG. 3, described above, is considerably different. For example, due to the air-side heat sink having a larger footprint, e.g., as compared to the microchannel heat sink assembly, many more microchannels, having much greater surface area, may be employed.

In conventional microchannel systems, it is critical that microchannels be employed only where extremely efficient heat transfer is necessary, due to the high pressure drop associated with them. However, given the teachings of the present invention, this is no longer the case. Namely, employing nanoposts with hydrophobic coatings in the microchannels mitigates the pressure drop associated with the microchannels. For example, according to an exemplary embodiment, the overall pressure drop associated with transporting the heat-transfer fluid, the heat-transfer fluid being water, through the entire system would be less than or equal to about five atm, preferably less than or equal to about one atm, this being greater than a ⅓ reduction in pressure drop as compared to conventional microchannels.

Further, as was described, for example, in conjunction with the description of FIG. 3, above, the heat-transfer components of microchannel cooling system 300, are fluidly connected by fluid conduits 306, 310 and 312, which favorably permits each component to be studied and optimized independently. However, according to an exemplary embodiment, a single, compact, monolithic thermal solution may also be employed, e.g., consolidating both the microchannel heat sink assembly and the air-side heat sink and perhaps the fluid pump as well into a single unit which simplifies installation and minimizes space requirements.

In comparison to the indirect liquid cooling techniques presented above, the present teachings may also be employed for direct liquid cooling. For example, the present techniques may be employed to cool heat sources having integrated microchannels with superhydrophobic nanostructures or other fluid flow effecting structures therein.

Such direct liquid cooling dramatically reduces the temperature difference between the heat source and the associated heat sink. Moreover, direct liquid cooling allows for hot spot mitigation on silicon dies, which is becoming increasingly more critical to overall thermal management. See, for example, R. Mahajan et al., *Emerging Directions for Packaging Technologies*, INTEL TECH JOURNAL (May, 2002), the disclosure of which is incorporated by reference herein.

The thermal resistances between the die and the package and between the package and the ambient air occur in series. Therefore, focusing on the thermal interface between the die and the package may be most beneficial. Although packages in the form of vapor chambers (e.g., large footprint, small thickness heat pipes) are presently used for hot spot mitigation on silicon dies, it is not expected that this will continue indefinitely because, beyond a maximum heat load and flux, a vapor chamber will dry out. Additionally, the undesirable thermal interface material (typically of very low thermal conductivity) currently present between the die and the package, e.g., a TIM material, may be eliminated in the context of direct liquid cooling using microchannels. Further, the microchannels may be fabricated right on the backside of the die. Alternatively, the microchannels may be fabricated out of silicon, or some other suitable material, and thermally connected to the die (the surfaces being expansion matched).

Heat transfer from the heat source to the heat-transfer fluid in the microchannels is governed by Newton's Law of Cooling, which states that $$q''(x,y)=h(x,y)[T_d(x,y)-T_f(x,y)],$$

wherein q"(x,y), h(x,y) and $T_f$(x,y) represent the (highly non-uniform) spatial dependence of the heat flux on the heat source, convective heat transfer coefficient between the heat source and the heat-transfer fluid, e.g., water, and the heat-transfer fluid temperature, respectively. $T_d$(x,y) is the temperature of the heat source. The objective is to maintain $T_d$ at a spatially-uniform value. q"(x,y) depends on the location on the die of preferential clustering of high power units, as was described above. Moreover, $T_f$(x,y) is spatially varying, because, as the heat-transfer fluid flows over the heat source and absorbs heat, its temperature increases.

Typically, h(x,y) is constant, i.e., independent of location. However, in the presence of the present hydrophobic coated nanoposts, h(x,y) is tunable, as detailed above. Based on the values of q"(x,y) and $T_f$(x,y) at a given location on the heat source, the value of h(x,y) may be tuned so that $T_d$ is approximately constant over the entire die. By varying the material (e.g., thermal conductivity), density (e.g., pitch), diameter and height of the nanoposts, the heat transfer coefficient may be spatially tuned to provide the distribution within an array of microchannels necessary to maintain spatially-uniform heat source temperature.

The heat-transfer fluid, having been cooled, e.g., from passage through the system, may be delivered to locations on the heat source where the heat flux (q"(x,y)) is extremely high, e.g., greater than or equal to about five times the average heat flux, via dedicated microchannels in which the nanoposts have been tuned such that heat transfer is minimized until the hot spot is reached. For example, as will be described below, the height of the nanoposts in the regions outside the vicinity of a hot spot might be increased to minimize heat transfer in those regions. In the vicinity of the hot spot, the nanoposts may be shorter, thicker or more closely spaced to maximize the heat transfer at that spot.

An alternative means of controlling or tuning heat transfer is to use temperature to control the penetration of the heat-transfer fluid through the nanoposts. The surface tension of any liquid (and thus the contact angle it forms with the nanoposts) depends on its temperature. Thus, the nanopost arrays may be designed in such a way as to induce the penetration of the heat-transfer fluid inside the nanopost layer at a temperature above a certain threshold temperature. This would allow automatic adjustment of the cooling system to the particular arrangement of the hot spots on the heat source surface. For example, beyond certain temperatures, surface tension of the fluid drops low enough so that the contact angle between the fluid and the nanoposts is less than 90 degrees. The fluid would then wet the walls of the microchannel. Further, the static pressure at which a fluid will penetrate the nanopost layer decreases as the fluid surface tension decreases and as the nanopost density decreases. Thus, the nanoposts may be arranged to be placed further apart from one another in the vicinity of a hot spot and/or a heat-transfer fluid may be employed that has a surface tension that decreases as the temperature increases.

For example, at the areas close to a hot spot, the heat-transfer fluid would penetrate through the nanopost layer, leading to a greater heat transfer coefficient. On other areas of the heat source, the heat-transfer fluid would remain suspended on the nanopost tips, thus leading to a lower heat transfer coefficient in those areas.

Other exemplary configurations are contemplated herein. For example, regarding an indirect liquid cooling application, a microchannel heat sink may be incorporated into a, e.g., lead frame and bonded to the heat source with a low-thermal impedance bond (e.g., a silicon-to-silicon bond or a thin, high-thermal-conductivity solder bond). By comparison, regarding a direct liquid cooling application, the microchannels could be etched into the heat source itself and a lead frame bonded to the heat source to seal the channels such that fluid could be pumped through them. In this embodiment, the microchannels are thermally in parallel with a thermal path through the heat source.

It is important to note that the flow rates of heat-transfer fluid required for direct liquid cooling are far smaller than for indirect liquid cooling. When conduction through the package is avoided, the driving force for heat transfer to the ambient equals the difference between the maximum heat-source operating temperature (e.g. 125° C.) and the ambient (e.g., 45° C.). In this example the driving force would equal 80° C. If, for example, even only a 24° C. fluid temperature rise in the microchannels were allowed, the flow rate required would be about 94 ml/min for a 150 Watt power dissipation. Moreover, this flow rate could be reduced even further because once the temperature of the surface of the heat source equals 125° C. (the mean heat source temperature), the corresponding saturation pressure of water is 2.25 atm and evaporation becomes possible. Exploiting the high latent heat of evaporation of water in such a two-phase system would allow much lower flow rates.

Once hot spots are eliminated on the heat source, it may operate at a higher mean temperature. This translates to a higher operating temperature of the air-side heat sink because of the increase in the total heat transfer driving force (temperature difference) available between the heat source junctions and the ambient air. Moreover, a smaller temperature difference is necessary to transfer the heat from the heat source to the heat-transfer fluid in the microchannel by direct liquid cooling, rather than through an intermediate package, further increasing the temperature of the air-side heat sink. The end result is improved overall system performance and greater flexibility for the design of computer housings. As such, heat sinks could occupy less volume for a given heat load, require slower fan speeds (lower noise levels) and transfer higher heat loads to the ambient air because of the increased heat sink operating temperature.

Figure 8:
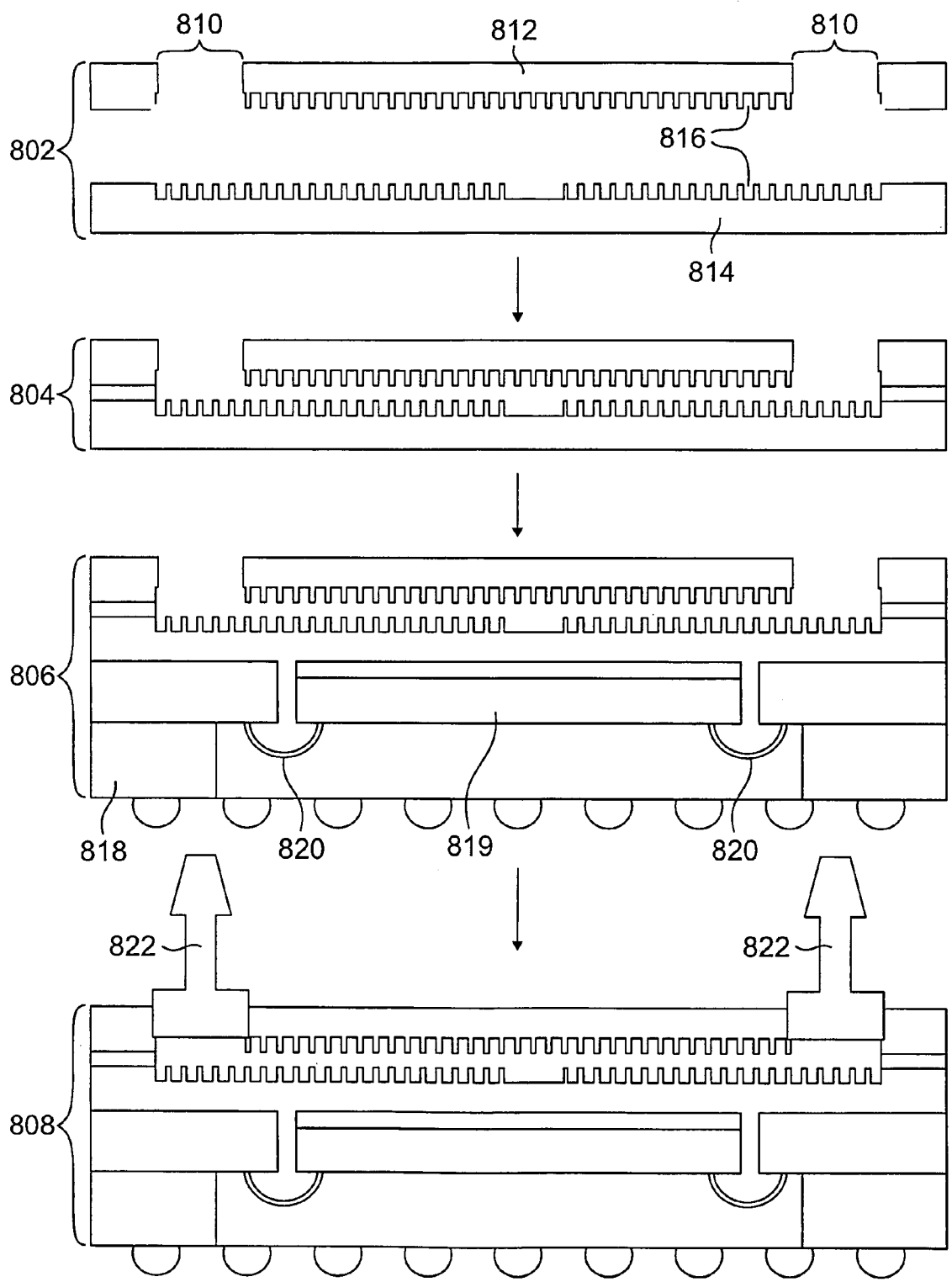
FIG. 8 is a diagram illustrating an exemplary methodology for fabricating a heat-transfer device.

FIG. 8 is a diagram illustrating an exemplary methodology for fabricating a heat-transfer device. Namely, the methodology presented in FIG. 8 may be used to fabricate a heat-transfer device, such as heat-transfer device 200, shown in, and described in conjunction with the description of, FIG. 2A, above.

In step 802, alignment holes (e.g., tooling holes) 810 are made in microchannel housing material 812. Nanotextured surfaces 816 are then etched or embossed in microchannel housing materials 812 and 814. In step 804, microchannel housing materials 812 and 814 are mated together and sealed, e.g., using an adhesive or solder. In step 806, printed wiring board 818, IC die 819 and wire bonds 820 are attached. In step 808, fluid fittings 822 are inserted.

According to another exemplary embodiment, as mentioned above, hot spots on a heat source may be addressed by delivering 'cooler' heat-transfer fluid to those areas, e.g., through dedicated microchannels. For example, certain microchannels may comprise a high density of superhydrophobic nanostructures in the areas in the flow path leading up to a hot spot arranged such that the amount of heat transfer in those areas is reduced. The fluid thus delivered to the hot spot would be cooler. At the hot spot, however, the superhydrophobic nanostructures can be shortened, eliminated or otherwise modified to provide greater cooling in that area.

According to a further exemplary embodiment, the superhydrophobic nanostructures may be adjusted so as not to significantly change heat transfer while reducing the pressure drop for a given fluid flow rate. According to this illustrative embodiment, the height of the superhydrophobic nanostructures is adjusted so that the superhydrophobic nanostructures are short enough such that the thermal resistance of the air layer and nanostructures in parallel is insignificant relative to the thermal resistance associated with the convection into the heat-transfer fluid. As such, heat transfer is substantially unaffected and pressure drop is reduced.

According to yet another exemplary embodiment, the microchannels may have protruding structures on at least one inner surface thereof which are adjusted to enhance heat transfer. For example, localized regions of the microchannel may comprise nanoposts without a hydrophobic coating. These structures would thus not be superhydrophobic. Therefore, in those regions, the heat-transfer fluid would not be prevented from contacting the walls of the microchannel. Wetting of the walls of the microchannel will enhance heat transfer in those areas. Thus, according to this illustrative embodiment, the nanopost structures enhance heat transfer. Further, these localized regions may have a dense array of such nanoposts to dramatically increase heat transfer surface area in those regions.

Further techniques are contemplated herein for enhancing heat transfer. For example, as above, the microchannels may have protruding structures on at least one inner surface thereof which are adjusted to enhance heat transfer. More specifically, the structures may comprise nanoposts coated with materials that exhibit different surface energies. This creates high energy surfaces which exhibit superhydrophobic behavior only below a certain temperature. For example, above this temperature, the heat-transfer fluid would be permitted to wet the walls of the microchannel. Further, coating other areas of nanoposts with the hydrophobic coatings described above (creating low surface energy surfaces) would ensure that those other areas exhibit superhydrophobic behavior regardless of temperature. This selective coating technology can be employed to tune, or otherwise adjust the system.

The teachings presented herein have broad applicability. For example, the present techniques may be employed in light emitting diode (LED) devices, including, but not limited to, projectors, displays, advertising signs, street lights, cellular phone with streaming video, hand held projectors (such as personal digital assistants (PDAs)); high power electronics, including, but not limited to, radars and military applications; and communication devices, including, but not limited to wireless tower-top electronics and microwave applications.

It is to be understood that these and other embodiments and variations shown and described in the examples set forth above and the figures herein are merely illustrative of the principles of this invention and that various modifications may be implemented by those skilled in the art without departing from the scope and spirit of the invention.

We claim:

1. A heat-transfer device comprising one or more microchannels suitable for containing a heat-transfer fluid, one or more of the microchannels having protruding structures on at least one inner surface thereof configured to affect flow of the heat-transfer fluid through the one or more microchannels, wherein said protruding structures comprise superhydrohobic nanostructured surfaces that reduce a resistance of said flow of the heat-transfer fluid.

2. The device of claim 1, wherein one or more of the structures comprise posts.

3. The device of claim 1, wherein the heat-transfer fluid is in thermal contact with a heat source.

4. The device of claim 1, wherein the heat-transfer fluid comprises water.

5. The device of claim 1, wherein a shortest cross sectional area dimension of the one or more microchannels is less than or equal to about 500 microns.

6. The device of claim 1, wherein one or more of the structures comprise posts coated with a hydrophobic coating.

7. The device of claim 6, wherein the hydrophobic coating comprises at least one of a fluorinated polymer, a fluorocarbon material having the general formula $CF_x$, a silane-based self-assembled monolayer and combinations comprising at least one of the foregoing materials.

8. The device of claim 2, wherein the posts comprise at least one of copper, silicon, aluminum, tungsten, alloys thereof and combinations comprising at least one of the foregoing materials.

9. The device of claim 2, wherein the posts comprise silicon dioxide.

10. The device of claim 1, further comprising a heat source, wherein the heat source comprises an integrated circuit die.

11. A method of removing heat from a heat source, the method comprising the step of:
   pumping a heat-transfer fluid, in thermal contact with the heat source, through one or more microchannels having protruding structures on at least one inner surface thereof in contact with the heat-transfer fluid, the structures being configured to affect flow of the heat-transfer fluid through the one or more microchannels, wherein said protruding structures comprise superhydrophobic nanostructured surfaces that reduce a resistance of said flow of the heat-transfer fluid.

12. The method of claim 11, wherein one or more of the structures comprise posts coated with a hydrophobic coating.

13. The method of claim 11, further comprising the step of varying at least one dimension of one or more of the structures to tune the heat removal from the heat source.

14. The method of claim 11, further comprising the step of varying one or more of the density, diameter, height and material of one or more of the structures to tune the heat removal from the heat source.

15. The method of claim 11, further comprising the step of configuring the structures to substantially isothermalize the heat source.

16. The method of claim 11, further comprising the step of configuring the structures to reduce at least a portion of a pressure drop in the heat-transfer fluid.

17. A heat-transfer system comprising:
a heat-transfer device comprising one or more microchannels suitable for containing at least a portion of a heat-transfer fluid, one or more of the microchannels having protruding structures on at least one inner surface thereof configured to affect flow of the heat-transfer fluid through the one or more microchannels, wherein said protruding structures comprise superhydrophobic nanostructured surfaces that reduce a resistance of said flow of the heat-transfer fluid;
at least one heat sink connected to the heat-transfer device; and
at least one pump suitable for circulating the heat-transfer fluid through the system.

18. The system of claim 17, further comprising one or more conduits, suitable for containing at least a portion of the heat-transfer fluid, connecting one or more of the heat-transfer device, the at least one heat sink and the at least one pump.

19. The system of claim 18, wherein one or more of the conduits comprise protruding structures on at least one inner surface thereof configured to affect flow of the heat-transfer fluid through the conduits.

20. The system of claim 17, wherein the at least one pump comprises a plurality of pumps operated in parallel, the plurality of pumps being suitable for circulating the heat-transfer fluid through the system.

21. An apparatus comprising:
one or more integrated circuits;
a heat-transfer device thermally connected to the one or more integrated circuits, the heat-transfer device comprising one or more microchannels suitable for containing a heat-transfer fluid, one or more of the microchannels having protruding structures on at least one inner surface thereof configured to affect flow of the heat-transfer fluid through the one or more microchannels, wherein said protruding structures comprise superhydrophobic nanostructured surfaces that reduce a resistance of said flow of the heat-transfer fluid.

* * * * *